United States Patent [19]

Hiscock et al.

[11] Patent Number: 4,868,241

[45] Date of Patent: Sep. 19, 1989

[54] ELECTRON BEAM AND X-RAY RESISTS

[75] Inventors: Laura J. Hiscock, Norwalk; Bruce H. Baretz, New Canaan; Richard L. Webb, Darien, all of Conn.

[73] Assignee: American Cyanamid Company, Stamford, Conn.

[21] Appl. No.: 946,993

[22] Filed: Dec. 29, 1986

Related U.S. Application Data

[63] Continuation of Ser. No. 828,000, Feb. 7, 1986, abandoned.

[51] Int. Cl.$^4$ ................................................ C08F 8/32
[52] U.S. Cl. .......................................... 525/59; 525/61
[58] Field of Search ...................................... 525/59, 61

[56] References Cited

U.S. PATENT DOCUMENTS

| | | | |
|---|---|---|---|
| 3,296,225 | 1/1967 | Worrall | 525/59 |
| 3,451,978 | 6/1969 | Chalmers | 260/78.5 |
| 3,454,674 | 7/1969 | Hardt et al. | 525/59 |
| 3,933,746 | 1/1976 | Steele | 525/59 |
| 4,061,829 | 12/1977 | Taylor | 427/43 |
| 4,080,346 | 3/1978 | Bedell | 525/59 |
| 4,301,231 | 11/1981 | Atarashi et al. | 430/287 |
| 4,559,389 | 12/1986 | Hatada et al. | 525/250 |
| 4,639,500 | 1/1987 | Kubo | 525/59 |
| 4,670,506 | 6/1987 | Goldenberg et al. | 525/59 |

FOREIGN PATENT DOCUMENTS 0092901 11/1983 European Pat. Off.
59-211037 11/1984 Japan.

*Primary Examiner*—Joseph L. Schofer
*Assistant Examiner*—Bernard Lipman
*Attorney, Agent, or Firm*—Steven H. Flynn

[57] ABSTRACT

Polymers are disclosed comprising a poly(vinyl alcohol) backbone with the following groups or combination of groups bound to the backbone:
(A) (substituted alkyl)benzoyl groups; or
(B) (substituted alkyl)benzoyl groups, and (vinyl)benzoyl groups; or
(C) (substituted alkyl)benzoyl groups, and (halo)benzoyl groups or (2-carboxy-3,4,5,6-tetrachloro) benzoyl groups;
(D) (substituted alkyl)benzoyl groups, (vinyl) benzoyl groups, and (halo)benzoyl groups or (2-carboxy-3,4,5,6-tetrachloro)benzoyl groups;
(E) (vinyl)benzoyl groups, and (halo)benzoyl groups or (2-carboxy-3,4,5,6-tetrachloro) benzoyl groups; or
(F) (halo)benzoyl groups.

Each of these polymers can optionally contain, bound to the poly(vinyl alcohol) backbone, (trialkylsily) benzoyl groups.

The benzoyl groups are randomly bound to the poly(vinyl alcohol) by ester linkages. Residual pendant hydroxy groups remain after the attachment of the benzoyl groups.

Also disclosed are the use of these polymers as radiation sensitive resists, such as, for example, x-ray and/or E-beam resists.

44 Claims, No Drawings

ELECTRON BEAM AND X-RAY RESISTS

This is a continuation, of application Ser. No. 828,000, filed Feb. 7, 1986 now abandoned.

FIELD

This invention relates to novel vinyl copolymers and their use as electron beam and x-ray resists.

BACKGROUND

The electronics industry is a rapidly growing field and considerable research is being done in the industry to make electronic components smaller and faster. To accomplish this the density of the components on the chip must be increased. Polymer coatings (resists) are the first step in creating the patterns on the chip and are, therefore, critically important. The resist forms these patterns after exposure to radiation by becoming either less soluble (negative resists) or more soluble (positive resists) to a certain solvent than the unexposed film. The resists must then withstand a variety of downstream processing steps such as etching and doping. A good and highly desirable resist should therefore have a high sensitivity to the form of irradiation used, high resolution, good adhesion to the substrate and good resistance to etching.

Presently, the forms of irradiation being used most to expose the resist are near ultraviolet (U.V.) and visible light. Without the addition of a number of time consuming processing steps, near U.V. and visible light can, at best, resolve images of about one micron due to diffraction effects of the light. To achieve the submicron features, the wavelength used must be shifted in the direction of electron beam or x-ray radiation. Of these two sources, electron-beam (E-beam) is presently the most important and is being used for mask making.

In general, the ideal resist, positive or negative, should be a glassy polymer with little or no tendency to swell during dissolution. The resist should be capable of exhibiting submicron resolution and its sensitivity to electron irradiation at 10 to 30 KeV should be in the order of $10^{-6}$ C/cm$^2$. The resist should also be sufficiently stable to withstand a variety of etching processes such as plasma and sputter etching, ion milling, etc.

In spite of the large amount of work over the past ten years the ideal resist has not as yet been developed. Most materials are deficient in one or more of the aforementioned requirements.

At the present time the industry requires E-beam negative resists that have a sensitivity of about one $\mu$C/cm$^2$, a resolution of less than one micron (<1$\mu$) and a good dry etch resistance, i.e., to plasma and sputter etching, ion milling, etc. The industry also requires x-ray negative resists having a sensitivity of less than 10 mJ/cm$^2$, a resolution of less than one micron (<1$\mu$) and good dry etch resistance to plasma and sputter etching, ion milling, etc.

Therefore, there exists a present need within the industry to provide resists which have the required sensitivity to their irradiation source while at the same time providing a resist that has good contrast, good resolution, good resistance to dry etching and good adhesion to the substrate.

A most welcome contribution to the art would therefore be a polymer which, when used as a resist, has good sensitivity, good contrast, good resolution, good resistance to dry etching, and good adhesion to the substrate when an x-ray or E-beam radiation source is used. Such a contribution is provided by this invention.

SUMMARY OF THE INVENTION

This invention provides polymers comprising a poly(vinyl alcohol) backbone with the following groups or combination of groups bound to the backbone:

(A) (substituted alkyl)benzoyl groups; or (B) (substituted alkyl)benzoyl groups, and (vinyl)benzoyl groups; or (C) (substituted alkyl)benzoyl groups, and (halo)benzoyl groups or (2-carboxy-3,4,5,6-tetrachloro)-benzoyl groups;

(D) (substituted alkyl)benzoyl groups, (vinyl)benzoyl groups, and (halo)benzoyl groups or (2-carboxy-3,4,5,6-tetrachloro)benzoyl groups;

(E) (vinyl)benzoyl groups, and (halo)benzoyl groups or (2-carboxy-3,4,5,6-tetrachloro)benzoyl groups; or (F) (halo)benzoyl groups.

Each of these polymers can optionally contain, bound to the (polyvinyl alcohol) backbone, (trialkylsilyl)benzoyl groups.

The benzoyl groups are randomly bound to the poly(vinyl alcohol) by ester linkages. The ester linkages are, for example, formed as a result of the reaction between the poly(vinyl alcohols) hydroxy groups and the carboxyl groups of the benzoyl groups. Not all of the hydroxy groups are reacted with benzoyl groups. Residual pendant hydroxy groups remain after the attachment of the benzoyl groups.

The polymers of this invention are useful as radiation sensitive resists, such as, for example, x-ray and/or E-beam resists.

DETAILED DESCRIPTION OF THE INVENTION

The (substituted alkyl)benzoyl groups are selected from the group consisting of (haloalkyl)benzoyl groups and [(R$_3^1$M)R$^2$] benzoyl groups, and the benzoyl groups are represented by the formula:

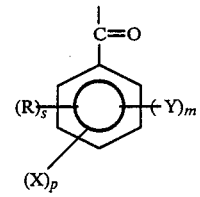

(I)

wherein each m for each benzoyl group is independently an integer of 1 to 5 with 1 being preferred; for each benzoyl group Y is the same or different (preferably the same) haloalkyl group, or for each benzoyl group each Y is the same or different (preferably the same) [R$_3^1$M)R$^2$] group; each s for each benzoyl group is independently an integer of 0 to (5-m) with 0 being preferred; each R is independently an alkyl group of 1 to about 3 carbon atoms (e.g., methyl, ethyl, propyl, and the like) with 1 to 2 being preferred and 1 being most preferred; each p for each benzoyl group is independently an integer of 0 to (5-m-s) with 0 being preferred; each X is independently a halogen (halo) atom selected from the group consisting of Cl, Br, F, and I with Cl or Br being preferred.

The alkyl group of the haloalkyl group of Formula I has from 1 to about 6 carbon atoms with 1 to about 3 being preferred and one being most preferred. The halo atoms of each haloalkyl group is independently selected from the group consisting of Cl, Br, F and I atoms with Cl being preferred.

For each $[(R_3{}^1M)R^2]$ group each $R^1$ is independently an alkyl group of 1 to about 6 carbon atoms (e.g., methyl, ethyl, propyl, pentyl, hexyl, and the like) with 1 to 3 being preferred and 1 being most preferred; $R^2$ is independently an alkyl group of 1 to about 6 carbon atoms with 1 to about 3 being preferred and 1 being most preferred; M is independently a Group IV metal selected from the group consisting of Ge, Sn, Si, and Pb, preferably M is Si.

The haloalkyl groups on a particular benzoyl group are the same or different. The $[(R_3{}^1M)R^2]$ groups on a particular benzoyl group are the same or different. The haloalkyl groups on different benzoyl groups are the same or different and the $[(R_3{}^1M)R^2]$ groups on different benzoyl groups are the same or different. However, preferably the haloalkyl groups on a particular benzoyl group are the same and preferably the haloalkyl groups are the same on different benzoyl groups. Preferably the $[(R_3{}^1M)R^2]$ groups on a particular benzoyl group are the same and preferably the $[(R_3{}^1M)R^2]$ groups are the same on different benzoyl groups.

Each haloalkyl group can vary in carbon number, halo atom number and/or type of halo atom. Preferably, if more than one halo atom is present in the haloalkyl group, the halo atoms are the same. When the alkyl portion of the alkyl group has more than one carbon atom the halo atoms are preferably bound to the α-carbon of the haloalkyl group (relative to the aromatic ring).

The $[(R_3{}^1M)R^2]$ groups can vary in M, $R^1$ and/or $R^2$. When $R^2$ has more than one carbon atom ($R^2$ is the bridging group between the aromatic ring and $R_3{}^1M$—) the $R_3{}^1M$ group is preferably bound to the α-carbon of $R^2$ (relative to the aromatic ring).

Preferably the meta and para positions are occupied first and most preferably the para position is occupied first. Preferably Y is a haloalkyl group.

Representative examples of the groups of Formula I include but are not limited to: 4-(chloromethyl)benzoyl; 4-(bromomethyl)benzoyl; 2-chloro-4-(chloromethyl)-benzoyl; 4-[(trimethylstannyl)methyl]benzoyl; 4-(2-iodoethyl)benzoyl; 3,4-bis(2-fluoroethyl)benzoyl; 2-methyl-4-(chloromethyl)-5-chlorobenzoyl; 3-(chloromethyl)benzoyl; 4-(1-chloroethyl)benzoyl; 3-(fluoromethyl)benzoyl; 4-(3-chloropropyl)benzoyl; mixtures thereof; and the like. The group 4-chloromethylbenzoyl is preferred.

The vinylbenzoyl groups are represented by the formula:

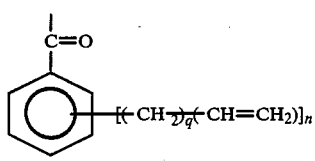

(II)

wherein each n for each benzoyl group is independently the integer 1 or 2 with 1 being preferred; and each q for each n is independently an integer of 0 to about 3 with 0 being preferred. Preferably the meta and para positions are occupied first and most preferably the para position is occupied first. Preferably n and q are the same for each benzoyl group present.

Representative examples of the groups of Formula II include but are not limited to: 4-vinylbenzoyl; 4-allylbenzoyl; 3,4-bis(vinyl)benzoyl; 3-allyl-4-vinylbenzoyl; 3-vinylbenzoyl; 3-allylbenzoyl; 4-(4-pentenyl)benzoyl; mixtures thereof; and the like. The group 4-vinylbenzoyl is preferred.

The halobenzoyl groups are represented by the formula:

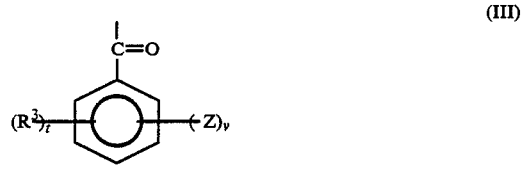

(III)

wherein each v for each benzoyl group is independently an integer of 1 to 5; for each benzoyl group each Z is independently a halo atom selected from the group consisting of Cl, Br, F and I with Cl or Br being preferred; each t for each benzoyl group is independently an integer of 0 to (5-v) with 0 or 1 being preferred; for each benzoyl group each $R^3$ is independently an alkyl group of 1 to about 3 carbon atoms (e.g., methyl, ethyl, propyl, and the like) with 1 to 2 being preferred and 1 being most preferred. Preferably for a particular benzoyl group each Z is the same and each $R^3$ is the same. When only one group is present, either Z or $R^3$, it is preferred that the para position be occupied by that group. When both a Z and $R^3$ group are present it is preferred that the $R^3$ group occupy the para position.

Examples of the groups of Formula III include but are not limited to: 4-chlorobenzoyl; 2,4-dichlorobenzoyl; 2,3,5,6-tetrachlorobenzoyl; 2,3,4,5-tetrachlorobenzoyl; 4-bromobenzoyl; 3-chlorobenzoyl; 3,5-dichlorobenzoyl; 2,3,5-trichlorobenzoyl; 2,3,6-trichlorobenzoyl; pentafluorobenzoyl; 2,3,5-trichloro-4-ethylbenzoyl; 2,3-difluoro-4-methylbenzoyl; 2,4-difluorobenzoyl; 2,3,4,5-tetrabromobenzoyl; 3-bromo-2,4-dichlorobenzoyl; 4-iodo-3-methylbenzoyl; 4-pentyl-2,3,5,6-tetrachlorobenzoyl; an isomeric mixture of chlorinated 4-methylbenzoyls (such as isomers selected from the group consisting of 3-chloro-, 3,5-dichloro-, 2,3-dichloro-, 2,3,6-trichloro-, and 2,3,5-trichloro-4-methylbenzoyls); mixtures thereof; and the like.

Instead of the groups of Formula III, Polymers (C)-(E) of this invention can have (2-carboxy-3,4,5,6-tetrachloro)benzoyl groups of the formula:

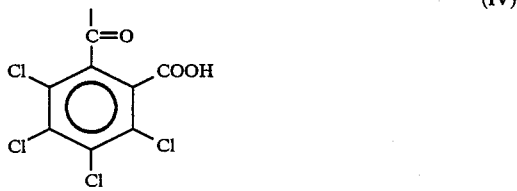

(IV)

The optional trialkylsilylbenzoyl groups are represented by the formula:

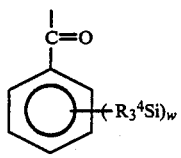
(V)

wherein each w for each benzoyl group is independently an integer of 1 to 5; for each trialkylsilyl ($R_3^4Si$) group $R^4$ is independently an alkyl group having from 1 to 7 carbon atoms (e.g., methyl, ethyl, propyl, butyl, pentyl, hexyl, heptyl, and the like) such that the trialkylsilyl group has up to a total of 9 carbon atoms, preferably each $R^4$ of a particular trialkylsilyl group is the same and most preferably it is methyl. Preferably the trialkylsilyl groups of each benzoyl group are the same. Preferably the meta and para positions are occupied first by the trialkylsilyl groups and most preferably the para position is occupied first.

Examples of the groups of Formula V include but are not limited to: 4-(trimethylsilyl)benzoyl; 3,4-bis(trimethylsilyl)benzoyl; 2-(triethylsilyl)-4-(trimethylsilyl)benzoyl; 3-(trimethylsilyl)benzoyl; 4-(tripropylsilyl)benzoyl; 4-(methyldiethylsilyl)benzoyl; mixtures thereof; and the like.

The polymers of this invention, as previously stated, have a poly(vinyl alcohol) backbone with one or more of the aforementioned groups randomly bound to the backbone by an ester linkage.

After the attachment of the benzoyl groups to the poly(vinyl alcohol) backbone there remains a residual amount of pendant hydroxy groups. The repeating units of the polymer having the hydroxy groups are represented by the formula:

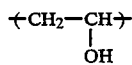
(VI)

The repeating units of Formula VI are present in an amount within the range of about 1 to about 25 mole % with about 10 to about 15 being preferred.

It is believed that silyating the residual hydroxy groups with trialkylsilyl groups of the formula:

$(R_3^5Si)$             (VII)

wherein each $R^5$ is independently an alkyl group of 1 to about 7 carbon atoms (e.g., methyl, ethyl, propyl, butyl, pentyl, hexyl, heptyl, and the like) such that the trialkylsilyl group has up to a total of 9 carbon atoms, preferably each $R^5$ of a particular trialkylsilyl group is the same and most preferably it is methyl, may prove useful to improve the polymer's adhesion to hydrophobic substrates.

Examples of the $(R_3^5Si)$ group include but are not limited to: trimethylsilyl; triethylsilyl; tripropylsilyl; methyldiethylsilyl; mixtures thereof; and the like.

Therefore, the polymers of this invention have randomly repeating units represented by the following formulas:

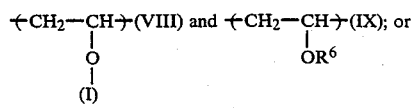
(A)

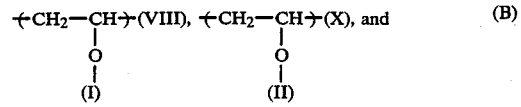
(B)

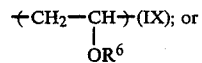

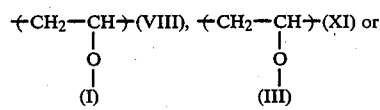
(C)

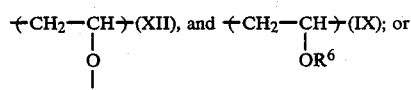

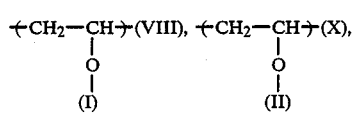
(D)

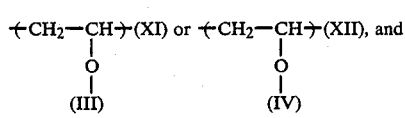

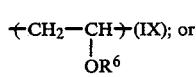

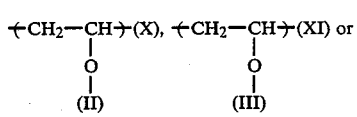
(E)

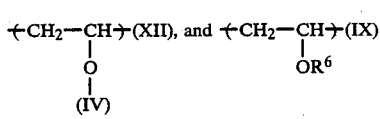

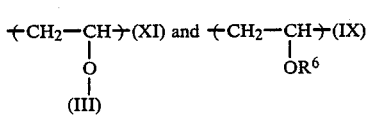
(F)

wherein each of (A) to (F) optionally have at least about 20 mole % of repeating units of:

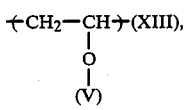

wherein I, II, III, IV, and V represent groups of Formulas I-V previously defined and each $R^6$ for each repeating unit is independently hydrogen (H) or a trialkylsilyl group of Formula VII (previously defined). Preferably each $R^6$ is the same and most preferably $R^6$ is hydrogen.

The amounts of these groups in the described polymers are as follows:

1. Polymers of (A):
From about 30 to about 100 mole % of repeating units of Formula VIII with about 70 to 95 being preferred and about 90 to about 95 being most preferred; and From about 0 to about 70 mole % of repeating units of Formula IX with about 5 to about 30 being preferred and about 5 to about 10 being most preferred.

2. Polymers of (B):

From about 50 to about 95 mole % of repeating units of Formula VIII with about 70 to about 90 being preferred and about 80 to about 85 being most preferred;

From about 5 to about 45 mole % of repeating units of Formular X with about 5 to about 25 being preferred and about 5 to about 15 being most preferred; and From about 5 to about 40 mole % of repeating units of Formula IX with about 5 to about 15 being preferred and about 5 to about 10 being most preferred.

3. Polymers of (C):

From about 5 to about 85 mole % of repeating units of Formula VIII with about 20 to about 60 being preferred and about 30 to about 50 being most preferred;

From about 5 to about 85 mole % of repeating units of Formula XI or XII with about 20 to about 60 being preferred and about 30 to about 50 being most preferred; and From about 5 to about 40 mole % of repeating units of Formula IX with about 5 to about 15 being preferred and about 5 to about 10 being most preferred.

4. Polymers of (D):

From about 5 to about 85 mole % of repeating units of Formula VIII with about 20 to about 60 being preferred and about 30 to about 50 being most preferred;

From about 5 to about 45 mole % of repeating units of Formula X with about 5 to about 25 being preferred and about 5 to about 15 being most preferred;

From about 5 to about 85 mole % of repeating units of Formula XI or XII with about 20 to about 60 being preferred and about 30 to about 50 being most preferred; and From about 5 to about 40 mole % repeating units of Formula IX with about 5 to about 15 being preferred and about 5 to about 10 being most preferred.

5. Polymers of (E):

From about 5 to about 45 mole % of repeating units of Formula X with about 5 to about 25 being preferred and about 5 to about 15 being most preferred;

From about 50 to about 95 mole % of repeating units of Formula XI or XII with about 70 to about 90 being preferred and about 80 to about 85 being most preferred; and From about 5 to about 40 mole % of repeating units of Formula IX with about 5 to about 15 being preferred and about 5 to about 10 being most preferred.

6. Polymers of (F):

From about 5 to about 95 mole % of repeating units of Formula XI with about 60 to about 90 being preferred and about 90 to about 95 being most preferred; and From about 5 to about 20 mole % of repeating units of Formula IX with about 5 to about 15 being preferred and about 5 to about 10 being most preferred.

The poly(vinyl alcohol) backbone of the polymers of this invention are derived from poly(vinyl alcohol) having a weight average molecular weight of at least about 3,000. Generally, the poly(vinyl alcohol) has a weight average molecular weight within the range of about 5,000 to about 800,000 with about 20,000 to about 400,000 being preferred and about 50,000 to about 200,000 being more preferred.

Therefore, the polymers of this invention having the previously described benzoyl groups pendent to the poly(vinyl alcohol) backbone can have a weight average molecular weight of at least about 15,000. Generally, the polymers of this invention can have a weight average molecular weight within the range of about 20,000 to about 3,000,000 with about 80,000 to about 1,600,000 being preferred and about 200,000 to about 800,000 being more preferred.

In general, the polymers of this invention yield resists that have an E-beam sensitivity within the range of about 0.03 to about 3.5 $\mu C/cm^2$ and a x-ray sensitivity within the range of about 4 to about 100 $mJ/cm^2$. Preferably the x-ray sensitivity is within the range of about 4 to about 20 $mJ/cm^2$. Generally, the polymers of this invention yield contrasts within the range of about 0.4 to about 4.5 and preferrably about 1.0 to about 4.5. Those skilled in the art will appreciate that the sensitivity of a polymer can be suitably modified for a particular end use by varying, for example, the molecular weight and/or the benzoyl groups attached to the polymer backbone. These modifications can be accomplished without undue experimentation.

The polymers of this invention can be illustrated in terms of the benzoyl groups pendent to the poly(vinyl alcohol) backbone. Examples therefore include but are not limited to polymers having the following pendant groups:

(1) 4-(chloromethyl)benzoyl;
(2) 4-(bromomethyl)benzoyl and 4-vinylbenzoyl;
(3) 4-(chloromethyl)benzoyl, 4-vinylbenzoyl, and 2-carboxy-3,4,5,6-tetrachlorobenzoyl;
(4) 4-(chloromethyl)benzoyl, pentafluorobenzoyl and 4-vinylbenzoyl;
(5) 4-(chloromethyl)benzoyl, 4-bromobenzoyl, and 4-vinylbenzoyl;
(6) 4-(chloromethyl)benzoyl, 4-vinylbenzoyl, and 2,4-dichlorobenzoyl;
(7) 4-(chloromethyl)benzoyl, 4-vinylbenzoyl, and 3,4-dichlorobenzoyl;
(8) 4-(chloromethyl)benzoyl, 4-vinylbenzoyl, and an isomeric mixture comprising tetrachlorobenzoyls:
(9) 4-(chloromethyl)benzoyl, 4-vinylbenzoyl, and 2,3,4,5-tetrachlorobenzoyl;
(10) 4-(chloromethyl)benzoyl, 4-vinylbenzoyl, 2,4-dichlorobenzoyl, and 4-bromobenzoyl;
(11) 4-(chloromethyl)benzoyl, 4-vinylbenzoyl, 2,4-dichlorobenzoyl, and 4-(trimethylsilyl)benzoyl;
(12) 4-(chloromethyl)benzoyl, 4-vinylbenzoyl, and an isomeric mixture of chlorinated 4-methylbenzoyls wherein the chlorine atoms are on the aromatic ring;
(13) 4-(chloromethyl)benzoyl, 3-vinylbenzoyl and 2,3,4,5-tetrabromobenzoyl;
(14) 4-(chloromethyl)benzoyl and 2,4-dichlorobenzoyl;

(15) 4-chloromethylbenzoyl, 4-vinylbenzoyl, 2,4-dichlorobenzoyl, 4-bromobenzoyl, and 4-(trimethylsilyl)benzoyl;
(16) 4-methyl-2,3,5-trichlorobenzoyl and 4-vinylbenzoyl;
(17) 3-methyl-2,4,5,6-tetrachlorobenzoyl;
(18) 4-propyl-3,4-dichlorobenzoyl and 3-vinylbenzoyl;
(19) 4-(chloromethyl)benzoyl and 4-vinylbenzoyl;
(20) 3-(1-chloropropyl)benzoyl and 4-allylbenzoyl;
(21) 2,4-bis(chloromethyl)benzoyl;
(22) 2,4,6-(tris-bromomethyl)benzoyl;
(23) 3-(3-chloropropyl)benzoyl and 2,3,5,6-tetrachlorobenzoyl;
(24) 2,4,6-tris(fluoromethyl)benzoyl; and 2-carboxy-3,4,5,6-tetrachlorobenzoyl; and
(25) 4-(chloromethyl)benzoyl, 4-vinylbenzoyl, and 4-(trimethylsilyl)benzoyl.

Without wishing to be bound by theory it is believed that the groups of Formulas I to V, the hydroxy groups of Formula VI and the trialkylsilyl groups of Formula VII have a particular function when the polymers of this invention are utilized as radiation sensitive resists (e.g., x-ray and E-beam resists). Formula I groups are believed to function as radical generators; Formula II groups are believed to function as cross-linker enhancers; Formula III and IV groups are believed to function as energy absorbers (absorbers of irradiation); Formula V groups are believed to improve dry etch resistance; the pendant hydroxy groups of Formula VI are believed to function as enhancers of resist adhesion to hydrophilic surfaces, e.g., silicon dioxide on silicon; and the trialkylsilyl groups of Formula VII are believed to improve the adhesion to hydrophobic substrates.

The Formula I radical generators are believed to function by producing free radicals from the haloalkyl or [(R$_3^1$M)R$^2$] portions of the benzoyl groups.

The Formula II cross-linker enhancers are believed to enhance the sensitivity of the polymer in forming negative images upon irradiation. Polymers without any Formula II groups would have utility in lithography where extreme sensitivity is not needed.

Examples of the concept of the Formula III groups as energy absorbers are, for example, the x-ray absorbers 2,4-dichlorobenzoyl and p-bromobenzoyl which preferentially absorb palladium (Pd) generated and tungsten (W) generated x-rays, respectively. Quite surprisingly and unexpectedly, it has been discovered that the addition of 2,4-dichlorobenzoyl groups to the polymers improves the contrast. It is believed that other dihalobenzoyl groups in general, and dichlorobenzoyl groups in particular will similarly improve the contrast.

The polymers of this invention are sensitive to radiation sources and the polymers have been described as particularly useful as x-ray and E-beam resists. It is also contemplated that the polymers of this invention will prove useful as resists sensitive to other radiation sources such as middle U.V., deep U.V., U.V., microwave, ion beam, and the like.

The polymers of this invention can be prepared by an acylation reaction (see for example, F. Arranz et al, Angew. Makromol. Chem. Vol. 92, P. 121–131, 1980) of the hydroxy groups of the poly(vinyl alcohol) (PVA) with the benzoyl chlorides of the groups of interest and with tetrachlorophthalic anhydride (from which the Formula IV groups are derived). All of the benzoyl chlorides utilized in the examples hereinafter are commercially available except for 4-vinylbenzoyl chloride; an isomeric mixture of chlorinated 4-methylbenzoyl chlorides, an isomeric mixture of tetrachlorobenzoyl chloride; and 2,3,4,5-tetrachlorobenzoyl chloride whose preparations are described below.

Preparation of 4-Vinylbenzoyl Chloride 4-vinyl benzoyl chloride was synthesized from 4-vinyl benzoic acid (obtained from Trans World Chemicals). The 4-vinyl benzoic acid was dissolved in chloroform with a small (0.16 mole/mole 4-vinyl benzoic acid) amount of nitrobenzene added as an inhibitor to prevent cross-linking. A large excess of thionyl chloride (six times the moles of benzoic acid) was added dropwise while stirring and gently heating to 50° C. Once the thionyl chloride was completely added, and the solution was at a temperature of 50° C., it was allowed to stir for one hour. The solution was then distilled (rotary evaporator) to remove the bulk of the chloroform and unreacted thionyl chloride. The impure 4-vinylbenzoyl chloride was then vacuum distilled to further purify it. At <1 mm mercury the 4-vinylbenzoyl chloride distills at around 70° C. The composition of the product was checked by NMR and was confirmed to be 4-vinylbenzoyl chloride. The yield was 91%.

Preparation of an Isomeric Mixture of Tetrachlorobenzoyl Chloride

The desired compound is prepared from tetrachlorobenzoic acid.

Following a literature procedure for pentachlorobenzoic acid (L. G. Zagorskaya et al, Zhur. Obschei. Khim, vol. 32 p. 2612–2613 (1962) CA 58-8964), 122 g (1 mole) of benzoic acid and 6.5 g of iodine crystals were dissolved in 500 ml of 96.2% sulfuric acid. Chlorine was introduced at room temperature but had no effect based on NMR ratio of aromatic H to exchangeable H in the mixture. Then following a second procedure (Japanese No. 69-24,588) the temperature was raised to 90° C. and chlorination continued for 10 hours. Addition to ice water gave a white solid. NMR indicated 70% replacement of aromatic hydrogens. After drying, 174 g of product was obtained and 167 g of this was redissolved in 500 ml of 96.2% sulfuric acid with 6.1 g iodine crystals. Chlorine was added for 3 more hours at 90° C. Addition to ice water gave a light gray solid which was collected, suspended in 1500 ml water, treated with 10 ml 10% sodium hydroxide and then collected on a filter. On drying, 106 g was obtained. This was recrystallized twice from toluene yielding 19 g of light gray solid which melted at 179°–182° C.

The desired tetrachlorobenzoyl chloride is prepared by reacting the tetrachlorobenzoic acid with thionyl chloride. A six fold molar excess of thionyl chloride is slowly added to the acid. This mixture is heated to reflux and held at this temperature for 1.25 hours. The solution is then cooled and the excess thionyl chloride vacuum distilled off. The solution is further distilled under vacuum to yield the pure tetrachlorobenzoyl chloride in 92–93% yield.

Preparation of 2,3,4,5-Tetrachlorobenzoyl Chloride

The desired compound is prepared from 3,4,5,6-tetrachlorophthalic acid.

143 g (0.5 moles) of tetrachlorophthalic anhydride and 45 g (1.1 moles) of sodium hydroxide were heated in 1 liter of water and then acidified with 109 ml 37% HCl. The resulting solid was washed on a filter with water until the filtrate pH became constant at 1.6. After drying, the 124.5 g of white solid showed no ionized carboxyl in the IR spectrum. The $^{13}C$ NMR spectrum agreed well with a published spectrum (M. J. Fitalt et al, J. Org. Chem. Vol. 47, p. 148-51, 1982) of the 3,4,5,6-tetrachlorophthalic acid (diacid).

The diacid is then decarboxylated to yield 2,3,4,5-tetrachlorobenzoic acid in accordance with the following procedure.

30.4 g (0.1 moles) of the diacid was heated in 500 ml of dimethyl sulfoxide for one hour at 175°-178° C., cooled to 90° C. and treated with 1500 ml water. The solid was collected and washed with 200 ml water. To remove a garlic-like odor, the solid was slurried in 200 ml of 1% $H_2O_2$ and then 250 ml water. The damp solid was dissolved in 125 ml ether, filtered to remove a little brown solid, and the filtrate shaken with 60 ml water. The ether layer was stirred 10 minutes with 14 g anhydrous $MgSO_4$, filtered, and the filtrate evaporated to dryness (20.7 g). The solid was heated with 200 ml heptane and collected on a filter. Its proton NMR agreed well with the expected structure of the benzoic acid. Its melting point, 190°-193° C., was consistent with the literature value of 194°-195° C. for the benzoic acid.

The desired 2,3,4,5-tetrachlorobenzoyl chloride was then obtained from the corresponding benzoic acid following the procedure for the reaction of the tetrachlorobenzoyl chloride with thionyl chloride previously described.

Preparation of Chlorinated 4-Methylbenzoyl Chlorides

One mole, 136 g, of 4-methylbenzoic acid and 6.5 g of iodine were dissolved in 500 ml of 96.5% aqueous $H_2SO_4$ (9.1 moles of $H_2SO_4$) by heating and stirring. Aqueous chlorine was added to the mixture for 15 hours at a pot temperature of 95°-105° C. The reaction mixture was added to 5000 grams of ice. The resulting insoluble solid was washed with water and dried. The proton NMR spectrum indicated an average of 2.5 chlorine atoms per molecule with no chlorine substitution in the methyl group. The mixture was converted to a mixture of acid chlorides by heating 61.5 g of product to reflux in 450 ml of chloroform and then adding 140 ml of thionyl chloride. After 4.7 hours at 58°-64°, the solvent and unreacted $SOCl_2$ were stripped under vacuum giving 80.3 g of crude product. Vacuum distillation yielded 4 fractions which were analyzed by proton NMR.

| CUT NO. | bp/mm | WT (g) | Cl ATOMS/MOLECULE |
|---|---|---|---|
| 1 | 92-95°/1.2 mm | 6.27 | 1.32 |
| 2 | 101-106°/1 mm | 15.14 | 2.44 |
| 3 | 101-115°/1 mm | 17.74 | 2.53 |
| 4 | 116-118°/1 mm | 13.80 | 3.26 |

Example 31 was prepared using a mixture of 1.40 g of Cut No. 1 and 2.29 g of Cut No. 2 to give a mixture of chlorinated 4-methylbenzoyl chlorides having an average of 2 Cl atoms per molecule, along with 13.89 g of 4-(chloromethyl)benzoyl chloride and 2.08 g of 4-vinylbenzoyl chloride with 2 grams of poly(vinyl alcohol) ($\overline{M}w=128,000$), 100 ml of 1-methyl-2-pyrrolidinone, 8.1 ml of pyridine and 0.45 ml of nitrobenzene. The procedure of Example 2 was followed except that 3.5 hours reaction time was used.

Preparation of 4-(trimethylsilyl)benzoyl Chloride

The 4-(trimethylsilyl)benzoyl chloride was prepared from 4-chlorotoluene through several reaction steps. Following known procedures (see Sleevi and Wolfe, Journal of Organic Chemistry, Vol. 45, p. 5204 to 5206) 4-(trimethylsilyl)toluene was synthesized from 4-chlorotoluene and trimethylchlorosilane. Then, following known procedures (see Tze-Shen Lin et al, Hua Hsueh Hsueli Pao, Vol. 26, p. 7 to 10 (1960); see also Chemical Abstracts 55:18654a (1961)) 4-(trimethylsilyl)toluene was oxidized to 4-trimethylsilyl benzoic acid. The 4-(trimethylsilyl)benzoyl chloride was prepared from the 4-(trimethylsilyl)benzoic acid following the procedure for preparing 4-vinylbenzoyl chloride previously described.

The following examples are provided for the purposes of illustration only. The examples should not be construed as limiting the invention in any way as variations of the invention are possible which do not depart from the spirit and scope of the appended claims.

In the examples illustrative of the polymer preparation, in order to avoid gelation of the reaction, mixture, the glassware was oven dried at a temperature above 100° C. The solvent was dried over TYPE 3Å molecular sieve, and pyridine with <0.1% water (weight/weight) was used. Dry nitrogen was slowly flowed through the reaction vessel from the time the apparatus was assembled until the reaction mixture was passed into methanol.

In Examples 1-6, 13-23, 24-26 and 28-36 poly(vinyl alcohol) having a calculated weight average molecular weight of 128,000 was utilized. The molecular weight was calculated from the intrinsic viscosity measurements and known published equations relating intrinsic viscosity to weight average molecular weight.

In Example 4, poly(vinyl alcohol) having a calculated weight average molecular weight within the range of about 38,000 to 50,000 was utilized. The weight average molecular weight was calculated from furnished Brookfield viscosity data. The viscosity was used to calculate a number average molecular weight within the range of about 19,000 to about 25,000 from which the weight average molecular weight was calculated (based on a known 2:1 ratio of weight average to number average molecular weight).

In Example 25 the poly(vinyl alcohol) used had a calculated weight average molecular weight of 133,000. The weight average molecular weight was calculated from intrinsic viscosity measurements and equations known to those skilled in the art relating intrinsic viscosity to weight average molecular weight.

EXAMPLE 1

Preparation of a Polymer Utilizing 4-(chloromethyl)benzoyl Chloride, 4-bromobenzoyl Chloride and 4-vinylbenzoyl Chloride The starting polymer, poly(vinyl alcohol), 6.0 g, 100% hydrolyzed with molecular weight of 128,000, was dissolved in dried 1-methyl-2-pyrrolidinone (250 ml) by stirring and heating to 106° C. After cooling, pyridine (24.3 g) and nitrobenzene (1.35 ml) were added. The temperature of the reaction mixture was maintained between 16° C. and 22° C. while a solution of 4-(chloromethyl)benzoyl chloride (41.67 g), 4-bromobenzoyl chloride (10.87 g) and 4-vinylbenzoyl chloride (6.24 g) in 1-methyl-2-pyrrolidinone (41 ml)

was drop added. After stirring for 6 hours, the reaction mixture was added dropwise to methanol (3 liters). The precipitate was collected and subsequently dissolved in acetone (150 ml) containing 4-methoxyphenol (150 mg). After stirring at room temperature for 10 hours, the solution was added to methanol (1500 ml). The resulting polymer was collected by filtration, and dried to constant weight, yielding 18.8 g.

EXAMPLE 2

Preparation of a Polymer Utilizing 4-(chloromethyl)benzoyl Chloride, 4-vinylbenzoyl Chloride and 2,4-dichlorobenzoyl Chloride 6.0 g. of poly(vinyl alcohol) (100% hydrolyzed, $\overline{Mw}=128,000$) was dissolved in 247.5 ml of dry 1-methyl-2-pyrrolidinone by heating with stirring to 123° C., followed by addition of 24.3 g of pyridine at that temperature. The solution was chilled to 15° C. and 1.35 ml of nitrobenzene was added. A solution of 41.67 g of 4-(chloromethyl)benzoyl chloride, 6.24 g of 4-vinylbenzoyl chloride and 10.37 g of 2,4-dichlorobenzoyl chloride in 54 ml of 1-methyl-2-pyrrolidinone was added dropwise over a 5 minute period. After 3 hours the solution was added dropwise to 3000 ml of methanol while stirring and the precipitated polymer was dissolved in 150 ml of acetone containing 150 mg of 4-methoxyphenol by stirring overnight. The mixture was centrifuged for 35 minutes at 3000 rpm and the resulting supernatant solution was diluted to 210 ml with acetone and added dropwise to 2000 ml methanol. The resulting precipitated polymer was dried to constant weight at room temperature under vacuum yielding 20.64 g.

The polymer was fractionated by adding methanol to a stirred 4% solution of the polymer containing 500 ppm of 4-methylphenol in acetone until 46 volumes of methanol per 100 parts of initial solution had been added. The turbid solution was centrifuged for 40–45 minutes at 3500 rpm. The precipitated polymer was dried in a room temperature vacuum oven.

EXAMPLE 3

Preparation of a Polymer Utilizing 4-(chloromethyl)benzoyl Chloride 4.0 g of poly(vinyl alcohol) (100% hydrolyzed, $\overline{Mw}$ 128,000) was dissolved in 165 ml of dry 1-methyl-2-pyrrolidinone by heating with stirring to 112° C. After 16.1 ml of pyridine was added, the solution was cooled to 12° C., a solution of 39.6 g 4-(chloromethyl)benzoyl chloride dissolved in 35 ml 1-methyl-2-pyrrolidinone was added. After 4.4 hours stirring at 1°–2° C., the reaction mixture was added to 2 liters of methanol and the precipitated polymer was dissolved in 100 ml of acetone. After a small amount of insoluble material was spun down in a centrifuge the supernate was added to 1 L of methanol. The precipitated polymer was dried to constant weight at room temperature (7.0 g).

EXAMPLE 4

Preparation of a Polymer Utilizing 4-(chloromethyl)benzoyl Chloride and 4-vinylbenzoyl Chloride with Bromine Exchange of the Chloride Atoms In the Prepared Polymer 2.00 g of poly(vinyl alcohol) (100% hydrolyzed, $\overline{Mw}=38,000$ to 50,000) was dissolved in 95 ml of dry 1-methyl-2-pyrrolidinone by heating with stirring to 94° C. After cooling to 24° C., 0.045 ml of nitrobenzene was added, followed by a solution of 17.2 g of 4-(chloromethyl)benzoyl chloride and 0.83 g of 4-vinylbenzoyl chloride in 5 ml of 1-methyl-2-pyrrolidinone. A small exotherm was noted when 7.87 g of dry pyridine (8.0 ml) was added. After 6.5 hours stirring at 2°–7° C., the reaction mixture was filtered and the filtrate added to 800 ml of water. The precipitate was dried under vacuum to constant weight (5.2 g). 2.0 g of dry polymer was dissolved in 200 ml dimethyl formamide. 2.00 g of sodium bromide was added to exchange the chlorine of the 4-(chloromethyl)benzoyl groups to bromine to make 4-(bromomethyl)benzoyl groups and the mixture stirred for 22 hours at which time the mixture was added to 1800 ml H$_2$O. The solid was collected on a filter and washed with three 100 ml portions of water and dried in vacuum to constant weight (1.88 g). The proton NMR peak for CH$_2$X had shifted from 4.45 to 4.2 δ. Elemental analysis gave 51.78% C, 4.21% H, 26.12% Br, and 1.94% Chlorine.

EXAMPLE 5

Preparation of a Polymer Utilizing 4-(chloromethyl)benzoyl Chloride, pentafluorobenzoyl Chloride and 4-vinylbenzoyl Chloride 1.00 g of poly(vinyl alcohol) (100% hydrolyzed, $\overline{Mw}=128,000$) was dissolved in 41 ml of dry 1-methyl-2-pyrrolidinone by stirring and heating to 117° C. During cooling 4.00 ml of dry pyridine was added. At 18° C., 0.22 ml of nitrobenzene and a solution of 5.70 g of 4-(chloromethyl)benzoyl chloride, 2.58 g of pentafluorobenzoyl chloride and 1.04 g of 4-vinylbenzoyl chloride in 3 ml of 1-methyl-2-pyrrolidinone were added. After 4.25 hrs of additional stirring at 18°–20° C., the mixture was added to 500 ml of methanol. The precipitate was dissolved in 25 ml of acetone containing 25 mg of 4-methoxy phenol. After centrifuging for 20 minutes at about 400 X G, the supernatant solution was added to 250 ml of methanol. After vacuum drying to constant weight, 0.42 g of polymer was obtained.

EXAMPLE 6

Preparation of a Polymer Utilizing 4-(chloromethyl)benzoyl Chloride, 4-vinylbenzoyl Chloride and Tetrachlorophthalic Anhydride 2.0 g of poly(vinyl alcohol) (100% hydrolyzed, $\overline{Mw}=128,000$) was dissolved in 82.5 ml of dry 1-methyl-2pyrrolidinone by stirring and heating to 115° C. 8.1 g of pyridine was added at the temperature and the mixture was cooled to 10° C. at which point 0.45 ml of nitrobenzene was added, followed by a mixture at 14.65 g of 4-(chloromethyl)benzoyl chloride, 2.08 g of 4-vinylbenzoyl chloride and 3.96 g of tetrachlorophthalic anhydride in 30 ml 1-methyl-2-pyrrolidinone. After three hours stirring at 8°–15° C., the reaction mixture was added to 1 L methanol. The polymer was collected, washed with methanol and dissolved in 50 ml acetone containing 50 mg of 4-methoxyphenol. To improve solubility, 15 ml of dimethyl sulfoxide was added. After centrifuging 30 minutes at 3500 rpm the supernate was added to 750 ml of methanol. The precipitated polymer was dried in vacuum, dissolved in 2-butanone and filtered with difficulty.

The polymers of Examples 1 to 6 were tested for their sensitivity and contrast resulting from exposure to irradiation. The results are given in Examples 7 to 12. The resists of Examples 7 to 12 were prepared for testing as follows, unless indicated otherwise.

One inch diameter, polished silica wafers purchased from Pensilco Corp. in Bradford, Pennsylvania are used.

The wafers are cut with a diamond-tipped pencil into 1 cm×1 cm squares (for resolution test whole 1 inch wafers were used). The chips are thoroughly cleaned before use. First, the chips are soaked in a 10% HF solution to remove any oxide layer. This is followed by repeating rinses with deionized and Millipore-filtered water. Finally, the chips are soaked in acetone, dried with a tissue and stored in a plastic container.

Spin coating solutions were prepared utilizing a five (w/w) percent solution of the dry polymer in an appropriate solvent that will dissolve the polymer, e.g. chlorobenzene, methyl ethyl ketone (MEK), combinations thereof, or the like. Inhibitor, 500 ppm 4-methoxyphenol, is added to prevent crosslinking. The solution is normally allowed to stir overnight to ensure all the polymer is in solution. The polymer solution is then pressure filtered through 0.2 micron filters in a Millipore Membrane Cell Model XX4204700. Normally, pressures of no more than 35 psi are required. The filtered solution is concentrated with a stream of nitrogen until it is about ten weight percent polymer. The polymer concentration was adjusted as required to obtain films with thickness in the range of 0.5 to 0.9 microns with spinning speeds in the range of about 3000 to about 8000 rpm.

Spin coating was carried out using a Headway Research Inc. Model EC101 laboratory spin coating apparatus. The clean wafer is centered on the turntable. Using an eyedropper the spinning solution is spread over the entire chip. The chip is then spun for 30 seconds at 5000 rpm. The thickness of the film is measured. If necessary the speed and/or concentration of the polymer solution is adjusted to obtain the desired film thickness of 0.5 to 0.9 microns.

Spin coated chips are dried under vacuum (<1 mm Hg) for ten minutes to remove solvent left in the film. If the film thickness is measured with a Watson-Barnet interference objective, the resist coating is then scratched, with a glass cover slip, to, but not into, the silicon wafer. A scratch line is not needed if a Nanospec® brand of Automatic Film Thickness Gauge is utilized. Since only relative film thickness is used, (i.e., thickness before exposure compared to thickness after exposure) the refractive indices of the films are not measured.

The thickness of the resist is measured by interference microscopy using an Olympus microscope with a Watson-Barnet interference objective or a Nanospec® brand of Automatic Film Thickness Gauge.

A Cambridge Stereoscan Model 100 Scanning Electron Microscope (SEM) is used to expose the resist-coated silicon chip to a series of different doses of electron beam radiation. The machine is set to scan the beam in a raster mode over a rectangle of about 0.45 by 0.50 mm. Ten to twenty areas are scanned at a fixed current but for varying time periods. The exposure dose for each (in units of $\mu$ coulombs per square centimeter) is calculated from the time, the current and the observed area of the rectangle after development.

The resists may be exposed to x-rays having a wavelength of 1–10 Å units with a range of 4–9 Å units being preferred. The exposure dose may be adjusted for each wavelength to compensate for variations in the percentage of the incident beam energy that is absorbed. The latter may be calculated from the thickness, density, and elementary composition of the resist together with the x-ray mass absorption coefficients for the elements at the particular wavelength (see, e.g., G. N. Taylor et al, Pol. Eng. and Sci., Vol. 17, pages 420–429, 1977).

The exposed resists are developed utilizing a solvent or solvent system that will remove the unexposed polymer without adversely affecting the exposed polymer. Solvents which are useful include, for example, chlorobenzene, MEK, isopropyl alcohol (IPA), combinations thereof, and the like.

The optimum development system is the weakest solvent system that will remove all of the unexposed film in a convenient period of time, such as, 30 seconds to one minute. A weak solvent system (normally a mixture of a solvent and a nonsolvent) is desired because it reduces swelling of the exposed resist. If the solvent system is too strong, the polymer networks will swell until they touch. When these swollen networks collapse, polymer strands will be deposited into areas that should be clear. This effect, called bridging, severely reduces the resists resolution and contrast but does not affect the sensitivity.

For example, one optimum system, as exemplified in the examples hereinbelow, is a mixture of MEK and IPA in a MEK:IPA ratio within the range of about 65:35 to about 35:65. An example of the effect of the ratio of the solvents in the developing solution is shown by a resist that would not develop after 3 minutes in a 60:40 MEK:IPA solution but developed within 30 seconds in a 65:35 MEK:IPA solution. One optimum development system found was to hold the chip with forceps in a stirred solution of 65:35 MEK:IPA for 45 seconds, followed immediately by 45 seconds immersing in stirred 35:65 MEK:IPA solution. The developed chip is then removed and dried in a stream of nitrogen or fluorocarbon gas. Similar or better results may be achieved by spraying the aforementioned solvents sequentially onto the coated substrate in the form of fine droplets. Spray periods as short as 15 seconds are adequate for the aforementioned compositions. Optimization of the solvent system can be achieved by those skilled in the art without undue experimentation.

Sensitivity and contrast are obtained from a dose-response curve, which is a plot of normalized thickness versus log dose for a certain resist. The normalized thickness is defined as: $t/t_o$, where "t" equals the thickness of the exposed and developed resist and "$t_o$" equals the thickness of the unexposed resist. The area of the exposed squares is measured and the dose is calculated using the following:

$$\text{dose, } \mu C/cm^2 = \frac{(\text{Amps}) \times \text{sec. at that current}}{\text{Area Exposed, } cm^2} \left( \times \frac{10^6 \mu C}{C} \right)$$

The sensitivity, $D^{0.5}$, is defined as the dose required to reach 50% thickness ($t/t_o = 0.5$). The contrast, which correlates well with the resolution, is defined as the slope of the log dose versus thickness curve.

Resolution is determined by producing a series of line-space relief patterns in the resist with variable spacing. The narrowest unexposed area that can be developed to the substrate is a measure of the resolution of the resist.

Examples 7 to 12 were performed in accordance with the above procedure unless indicated otherwise.

EXAMPLE 7

Sensitivity and Contrast of the Polymer of Example 1

The polymer of Example 1 was dissolved in chlorobenzene to make a 2.5% (w/v) solution and filtered through a 0.2 μm porosity filter. The sensitivity of the polymer film, on a silicon substrate, was 0.045 μC/cm$^2$ with a contrast of 0.67 when exposed to 10 KeV electrons. The sensitivity to palladium x-rays (4.36Å) was 6 mJ/cm$^2$ (when measured under a nitrogen atmosphere). The development solution was made by mixing MEK with IPA in a ratio of 65:35. The subsequently used rinse solution was made by mixing MEK with IPA in the ratio of 35:65.

EXAMPLE 8

Sensitivity and Contrast of the Polymer of Example 2

Films 0.6–0.7 microns thick were were obtained by spin coating the polymer of Example 2 and drying in a vacuum at room temperature. To make the spin coating solution the polymer was dissolved in chlorobenzene to make a 5% (w/v) solution which was then filtered through a 0.2 μm porosity filter. The sensitivity, D$^{0.5}$, to 10 KeV electrons was found to be 0.22 μC/cm$^2$ (contrast=1.7) using spray development for 20 seconds with 65:35 MEK:IPA followed by 20 seconds with 35:65 MEK:IPA.

Using similar coating and development methods, the sensitivity to Pd x-rays (4.36Å) was found to be 50 mJ/cm$^2$ and resolution was less than 1 micron.

EXAMPLE 9

Sensitivity and Contrast of the Polymers of Example 3

The sensitivity, D$^{0.5}$, of the polymer films of Example 3 to 10 KeV electrons was 0.66 μC/cm$^2$ with a contrast of 0.68. The spin coating solution was made by dissolving the polymer in 1-methyl-2-pyrrolidinone to make a 7% (w/v) solution which was then centrifuged for 90 minutes at 5000 rpm. The development solvent was pyridine.

EXAMPLE 10

Sensitivity and Contrast of the Polymer of Example 4

The 10 KeV electron beam sensitivity, D$^{0.5}$, for the polymer of Example 4 was found to be 0.13 μC/cm$^2$ with a contrast of 0.78. The spin coating solution was made by dissolving the polymer in cyclohexanone to make a 10% (w/v) solution which was then centrifuged for 30 minutes at 5000 rpm. The development solvent was pyridine.

EXAMPLE 11

Sensitivity and Contrast of the Polymer of Example 5

The sensitivity, D$^{0.5}$, of films of the polymer of Example 5 from MEK to 10 KeV electrons was found to be 0.65 μC/cm$^2$ with contrast=0.83. The spin coating solution was made by dissolving the polymer in MEK to make a 5% (w/v) solution which was then centrifuged for 5 minutes at 400 xG. The development solvent was 100% MEK.

EXAMPLE 12

Sensitivity and Contrast of the Polymers of Example 6

A film spun from the polymer of Example 6 demonstrated a sensitivity, D$^{0.5}$, to 10 KeV electrons of 0.098 μC/cm$^2$ and a contrast of 3.2. The spin coating solution was made by dissolving the polymer in MEK to make a 5% (w/v) solution which was then filtered through a 0.2 μm porosity filter. The development solution was made by mixing MEK and IPA in a ratio of 65:35 followed by further development using a ratio of 35:65.

The results of Examples 7–12 are summarized in Table 1. The abbreviations utilized in the Tables that follow are:

| | |
|---|---|
| PVA: | Poly(vinyl alcohol) |
| PCM: | 4-chloromethylbenzoyl chloride |
| PC: | 4-chlorobenzoyl chloride |
| PB: | 4-bromobenzoyl chloride |
| PV: | 4-vinylbenzoyl chloride |
| 2,4-DC: | 2,4-dichlorobenzoyl chloride |
| 3,4-DC: | 3,4-dichlorobenzoyl chloride |
| PF: | pentafluorobenzoyl chloride |
| TCP: | tetrachlorophthalic anhydride |
| S: | sensitivity |
| C: | contrast |
| R: | resolution |
| CB: | chlorobenzene |
| MEK: | methyl ethyl ketone |
| TCIM: | an isomeric mixture of tetrachlorobenzoyl chlorides whose preparation was previously described. |
| TCB: | 2,3,4,5-tetrachlorobenzoyl chloride |
| CPM: | a mixture of isomeric chlorinated 4-methylbenzoyl chlorides whose preparation was previously described. |
| DMSO: | dimethyl sulfoxide |
| W: | tungsten |
| Pd: | palladium |
| PTMS: | 4-trimethylsilylbenzoyl chloride |
| EX: | Example |

TABLE 1
RESULTS OF EXAMPLES 7–12

| | ACYLATING SOLUTION, MOLE % | | | | | | E-BEAM: S & C | | X RAY S & R | |
|---|---|---|---|---|---|---|---|---|---|---|
| EX | PCM | PB | PV | 2,4 DC | PF | TCP | S (μC/cm$^2$) | C | S (C/cm$^2$) | R (μm) |
| 7 | 72 | 16 | 12 | — | — | — | 0.045 | 0.67 | 6 (Pd) | — |
| 8$^{(a)}$ | 72 | — | 12 | 16 | — | — | 0.22 | 1.7 | 50 (Pd) | <1 |
| 9 | 100 | — | — | — | — | — | 0.66 | 0.68 | — | — |
| 10 | 91$^{(b)}$ | — | 9 | — | — | — | 0.13 | 0.78 | — | — |
| 11 | 63 | — | 13 | — | 24 | — | 0.056 | 0.83 | — | — |
| 12 | 74.7 | — | 12 | — | — | 13.3 | 0.098 | 3.2 | — | — |

$^{(a)}$Fractionated
$^{(b)}$Reacted with sodium bromide to exchange the chlorine atoms with bromine atoms resulting in 4-bromomethylbenzoyl groups.

Table 2 reports data for polymers of this invention made and tested following the procedures set forth heretofore. The weight average molecular weight of the PVA utilized in these examples was 128,000. The spin coating solutions, development solutions and type of development used for Examples 13 to 23 is reported in Table 3. The E-beam sensitivity, $D^{0.5}$, in Table 2 is to 10 KeV electrons.

dures set forth heretofore. The weight average molecular weight of the PVA utilized was 133,000 for Example 25 and 128,000 for Example 24 and 26 to 36. The spin coating solutions, development solutions and type of development used for Examples 24 to 36 is reported in Table 5. The E-beam sensitivity, $D^{0.5}$, in Table 4 is to 10 KeV electrons.

TABLE 2

| | POLYMERS OF THIS INVENTION | | | | | | | | |
|---|---|---|---|---|---|---|---|---|---|
| | ACYLATING SOLUTION, MOLE % | | | | | | | E-BEAM S & C | |
| EX | PCM | PV | 2,4 DC | 3,4 DC | TCIM | TCP | PB | S ($\mu$C/cm$^2$) | C |
| 13 | 72 | 12 | — | 16 | — | — | — | 0.17 | 1.21 |
| 14[a] | 72 | 12 | 16 | — | — | — | — | 0.18 | 1.3 |
| 15[a] | 72 | 12 | — | — | — | — | 16 | 0.16 | 4.5 |
| 15 | 72 | 12 | — | — | — | — | 16 | 0.1 | 3.1 |
| 16 | 72 | 12 | — | — | — | — | 16 | 0.1 | 1.3 |
| 17[a] | 72 | 12 | 16 | — | — | — | — | 0.22 | 1.42 |
| 18[a] | 72 | 12 | 16 | — | — | — | — | 0.2 | 1.42 |
| 19[a] | 72 | 12 | 16 | — | — | — | — | 0.18 | 1.39 |
| 20[b] | 72 | 12 | — | — | 16 | — | — | 0.17 | 2.2 |
| 21[b] | 76 | 12 | — | — | 12 | — | — | 0.057 | 2.47 |
| 22 | 76 | 12 | — | — | — | 12 | — | 0.1 | 2.47 |
| 23 | 72 | 12 | 4 | — | — | — | 12 | 0.14 | 2.7 |

[a]Fractionated
[b]More inhibitor than normal used, i.e., 2 ml/gPVA used of nitrobenzene compared to 0.2 ml/gPVA.

The polymer of Example 17 had a sensitivity of 50 mJ/cm$^2$, a contrast of 1.01 and a resolution of 0.8 microns when exposed to palladium x-rays (4.36 Å).

TABLE 3

| | SPIN COATING SOLUTION AND DEVELOPMENT SOLUTION | | | | | |
|---|---|---|---|---|---|---|
| | SPIN COATING | DEVELOPMENT SOLUTION | | | | TYPE OF |
| | | SOLVENT | | RATIO | | |
| EX | SOLVENTS | A | B | A:B[a] | A:B[b] | DEVELOPMENT |
| 13 | CB | MEK | IPA | 65:35 | 35:65 | DIP |
| 14[c] | CB | MEK | IPA | 65:35 | 35:65 | DIP |
| 15[c] | MEK & CB | MEK | IPA | 65:35 | 35:65 | DIP |
| 15 | MEK & CB | MEK | IPA | 65:35 | 35:65 | DIP |
| 16 | CB | MEK | IPA | 65:35 | 35:65 | DIP |
| 17[c] | CB | MEK | IPA | 65:35 | 35:65 | DIP |
| 18[c] | CB | MEK | IPA | 65:35 | 35:65 | DIP |
| 19[c] | CB | MEK | IPA | 65:35 | 35:65 | SPRAY |
| 20 | MEK | MEK | IPA | 65:35 | 35:65 | SPRAY |
| 21 | MEK | MEK | IPA | 65:35 | 35:65 | SPRAY |
| 22 | MEK & CB | MEK | IPA | 65:35 | 35:65 | SPRAY |
| 23 | CB | MEK | IPA | 65:35 | 35:65 | SPRAY |

[a]First treatment
[b]Second treatment
[c]Fractionated

Table 4, Examples 24 to 36, reports data for polymers of this invention made and tested following the procedures

TABLE 4

| | POLYMERS OF THIS INVENTION | | | | | | | | | |
|---|---|---|---|---|---|---|---|---|---|---|
| | ACYLATING SOLUTION, MOLE % | | | | | | | | E-BEAMS S & C | |
| EX | PCM | PV | 2,4 DC | TCIM | TCB | PB | PTMS | CPM | $\mu$C/Scm$^2$ | C |
| 24 | 76 | 12 | — | 12 | — | — | — | — | 0.094 | 1.0 |
| 25 | 72 | 12 | 16 | — | — | — | — | — | 0.31 | 1.4 |
| | | | | | | | | | 0.21[a] | 2.2[a] |
| 26 | 72 | 12 | 1.5 | — | — | 14.5 | — | — | — | — |
| 27 | 72 | 12 | 2.6 | — | — | 13.4 | — | — | 0.18 | 0.84 |
| | | | | | | | | | 0.03[b] | 1.3[b] |
| 28 | 72 | 12 | 1.5 | — | — | 14.5 | — | — | 0.165 | 1.74 |
| 29 | 72 | 12 | 1.5 | — | — | 14.5 | — | — | 0.205 | 1.96 |
| | | | | | | | | | 0.23[b] | 1.8[b] |
| 30 | 36 | 12 | 16 | — | — | — | 36 | — | 0.56 | 1.05 |
| 31 | 72 | 12 | — | — | — | — | — | 16 | 0.10 | 0.68 |
| 32 | 72 | 12 | 2.6 | — | — | 13.4 | — | — | 0.175 | 0.72 |
| 33 | 76 | 12 | — | — | — | — | 16 | — | 0.19 | 2.4 |
| 34[c] | 76 | 12 | — | 12 | — | — | — | — | — | — |
| 35[c] | 76 | 12 | — | — | 12 | — | — | — | — | — |
| 36[d] | 72 | 12 | 2.6 | — | — | 13.4 | — | — | — | — |

[a]High molecular weight fraction, fractionated following the procedure of Example 2.
[b]Not filtered through 0.2 micron filter.
[c]Poor results for S & C possibly due to DMSO utilized to help solvate the polymer for spinning.
[d]considerable gel formed.

TABLE 5

SPIN COATING SOLUTION AND DEVELOPMENT SOLUTION

| EX | SPIN COATING SOLVENTS | DEVELOPMENT SOLUTION SOLVENTS A | B | RATIO $A:B^{(a)}$ | $A:B^{(b)}$ | TYPE OF DEVELOPMENT |
|---|---|---|---|---|---|---|
| 24 | CB & MEK | MEK | IPA | 65:35 | 35:65 | SPRAY |
| 25 | CB | MEK | IPA | 65:35 | 35:65 | SPRAY |
| 27 | CB & MEK | MEK | IPA | 65:35 | 35:65 | SPRAY |
| 28 | CB | MEK | IPA | 65:35 | 35:65 | SPRAY |
| 29 | CB | MEK | IPA | 65:35 | 35:65 | SPRAY |
| 30 | CB | MEK | IPA | 65:35 | 35:65 | SPRAY |
| 31 | CB & MEK | MEK | IPA | 65:35 | 35:65 | SPRAY |
| 32 | CB & MEK | MEK | IPA | 65:35 | 35:65 | SPRAY |
| 33 | CB | MEK | IPA | 65:35 | 35:65 | SPRAY |
| 34 | CB & MEK | CB | IPA | 65:35 | 35:65 | SPRAY |
| 35 | CB & MEK | CB | IPA | 65:35 | 35:65 | SPRAY |

$^{(a)}$First Treatment
$^{(b)}$Second Treatment

EXAMPLE 37

Preparation of a Polymer Utilizing 4-Chloromethylbenzoyl Chloride and 2,4-Dichlorobenzoyl Chloride Four grams of 100% hydrolyzed poly(vinyl alcohol) having a weight average molecular within the range of about 38,000 to about 50,000 was dissolved in 165 ml dry 1-methyl-2-pyrrolidinone by stirring while heating to 120° C. While at 120° C., 16.2 ml pyridine was added. The solution was cooled to 30° C. in an ice-water bath and 0.9 ml nitrobenzene was added. A solution containing 31.64 g 4-(chloromethyl)benzoyl chloride, 7.88 g 2,4-dichlorobenzoyl chloride and 36 ml dry 1-methyl-2-pyrrolidinone was added dropwise over 5 minutes. The solution was further cooled to 5°-11° C. and reacted for three hours. After this time the solution was added dropwise to 2000 ml methanol while stirring. The precipitated polymer was collected and rinsed with methanol. The precipitated polymer was then dissolved in 100 ml acetone containing 100 mg 4-methoxyphenol and stirred overnight. The mixture was centrifuged for 35 minutes at 3500 rpm. The supernate was added to 1500 ml methanol dropwise while stirring. The precipitated polymer was collected by filtration, rinsed with methanol and then dried under vacuum at room temperature. The product weight was 13.4 grams.

EXAMPLE 38

The dry etch rate of the resist made from the polymer of Example 14 in a $CF_4$ plasma at $7 \times 10^{-5}$ torr was 264Å/min, compared to 370Å/min with DCoPA (a blend of glycidyl methacrylate/ethylacrylate copolymer and poly(2,3-dichloropropyl acrylate)) a commercial resist of Great Lakes Chemical Company.

Optimum polymers were sometimes not obtained due to, for example, varying solubility characteristics, premature gelation and the like. This can be avoided by careful processing techniques.

What is claimed is:

1. A polymer comprising a poly(vinyl alcohol) backbone with benzoyl groups randomly bound to said backbone by ester linkages, said polymer having the repeating units

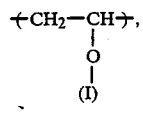 (i)

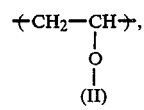 (ii)

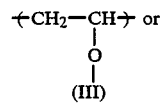 (iii)

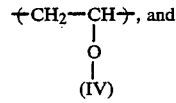 (iv)

wherein each repeating unit of (i) to (iv) may be the same or different; and wherein (I) represents benzoyl groups having the formula:

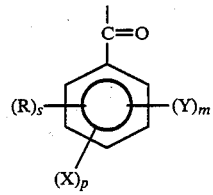

wherein m is independently an integer of 1 to 5; Y is independently a haloalkyl group having from 1 to about 6 carbon atoms wherein said halo atoms are selected from the group consisting of Cl, Br, F and I atoms; or Y is independently $[(R_3{}^1M)R^2—]$, wherein $R^1$ is an alkyl group having from 1 to about 6 carbon atoms; $R^2$ is an alkyl group having from 1 to about 6 carbon atoms; and M is a Group IV metal selected from the group consisting of Ge, Sn, Si, and Pb;

each s for each benzoyl group is independently an integer of 0 to (5-m);

each R is independently an alkyl group having 1 to about 3 carbon atoms;

each p for each benzoyl group is independently an integer of 0 to (5-m-s); and each X is independently a halo atom selected from the group consisting of Cl, Br, F and I atoms;
wherein (II) represents benzoyl groups having the formula:

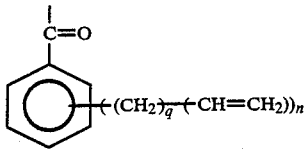

wherein each n for each benzoyl group is independently the integer 1 or 2; and
each q for each n is independently an integer of 0 to about 3;
wherein (III) represents benzoyl groups having the formula:

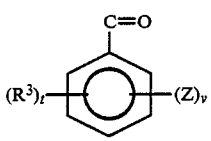

wherein each v for each benzoyl group is independently an integer of 1 to 5;
for each benzoyl group each Z is independently a halo atom selected from the group consisting of Cl, Br, F and I;
each t for each benzoyl group is independently an integer of 0 to (5-v); and
for each benzoyl group each $R^3$ is independently an alkyl group of 1 to about 3 carbon atoms;
wherein (IV) represents benzoyl groups having the formula:

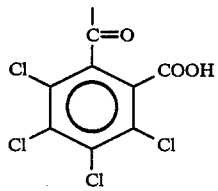

wherein each $R^6$ is independently a hydrogen atom or a ($R^5Si$) group wherein each $R^5$ is independently an alkyl group of 1 to about 7 carbon atoms such that said ($R_3^5Si$) group has up to a total of 9 carbon atoms; and
wherein said polymer has from about 5 to about 85 mole % of repeating units of (i), from about 5 to about 45 mole % of repeating units of (ii), from about 5 to about 85 mole % of repeating units of (iii) and from about 5 to about 40 mole % of repeating units of (iv).

2. The polymer of claim 1 wherein $R^6$ is hydrogen.
3. The polymer of claim 1 wherein M is 1, s is 0 or 1, p is 0 or 1, n is 1, q is 0 or 1, v is 1 to 4, t is 0 or 1, R is selected from the group consisting of methyl or ethyl, and $R^3$ is selected from the group consisting of methyl and ethyl.
4. The polymer of claim 1 wherein s is 0, p is 0, q is 0 and Y is a haloalkyl group.
5. The polymer of claim 1 wherein said benzoyl groups of (I) are selected from the group consisting of 4-(chloromethyl)benzoyl; 4-(bromomethyl)benzoyl; 2-chloro-4-(chloromethyl)benzoyl; 4-[(trimethylstannyl)methyl]benzoyl; 4-(2-iodomethyl)benzoyl; 3,4-bis-(2-fluoroethyl)benzoyl; 2-methyl-4-(chloromethyl)-5-chlorobenzoyl; 3-(chloromethyl)benzoyl; 4-(1-chloroethyl)benzoyl; 3-(fluoromethyl)benzoyl; 4-(3-chloropropyl)benzoyl or a mixture thereof;
said benzoyl groups of (II) are selected from the group consisting of 4-vinylbenzoyl; 4-allylbenzoyl; 3,4-bis-(vinyl)benzoyl; 3-allyl-4-vinylbenzoyl; 3-vinylbenzoyl; 3-allylbenzoyl and 4-(4-pentenyl)benzoyl; and a mixture thereof;
said benzoyl groups of (III) are selected from the group consisting of 4-chlorobenzoyl; 2,4-dichlorobenzoyl; 2,3,5,6-tetrachlorobenzoyl; 2,3,4,5-tetrachlorobenzoyl; 4-bromobenzoyl; 3-chlorobenzoyl; 3,5-dichlorobenzoyl; 2,3,5-trichlorobenzoyl; 2,3,6-trichlorobenzoyl; pentafluorobenzoyl; 2,3,5-trichloro-4-ethylbenzoyl; 2,3-difluoro-4-methylbenzoyl; 2,4-difluorobenzoyl; 2,3,4,5-tetrabromobenzoyl; 3-bromo-2,4-dichlorobenzoyl; 4-iodo-3-methylbenzoyl; 4-pentyl-2,3,5,6-tetrachlorobenzoyl; and a mixture thereof.

6. The polymer of claim 1 wherein $R^6$ is hydrogen and (I) is 4-chloromethylbenzoyl.
7. The polymer of claim 1 wherein $R^6$ is hydrogen, (I) is 4-(bromomethyl)benzoyl and (II) is 4-vinylbenzoyl.
8. The polymer of claim 1 wherein $R^6$ is hydrogen, (I) is 4-(chloromethyl)benzoyl, (II) is 4-vinylbenzoyl and (IV) is 2-carboxy-3,4,5,6-tetrachlorobenzoyl.
9. The Polymer of claim 1 wherein $R^6$ is hydrogen, (I) is 4-(chloromethyl)benzoyl, (III) is pentafluorobenzoyl, and (II) is 4-vinylbenzoyl.
10. The Polymer of claim 1 wherein $R^6$ is hydrogen, (I) is 4-(chloromethyl)benzoyl, (III) is 4-bromobenzoyl and (II) is 4-vinylbenzoyl.
11. The Polymer of claim 1 wherein $R^6$ is hydrogen, (I) is 4-(chloromethyl)benzoyl, (II) is 4-vinylbenzoyl and (III) is 2,4-dichlorobenzoyl.
12. The Polymer of claim 1 wherein $R^6$ is hydrogen, (I) is 4-(chloromethyl)benzoyl, (II) is 4-vinylbenzoyl and (III) is 3,4-dichlorobenzoyl.
13. The Polymer of claim 1 wherein $R^6$ is hydrogen, (I) is 4-(chloromethyl)benzoyl, (II) is 4-vinylbenzoyl, and (III) is an isomeric mixture of tetrachlorobenzoyls.
14. The Polymer of claim 1 wherein $R^6$ is hydrogen, (I) is 4-(chloromethyl)benzoyl, (II) is 4-vinylbenzoyl, and (III) is 2,3,4,5-tetrachlorobenzoyl.
15. The Polymer of claim 1 wherein $R^6$ is hydrogen, (I) is 4-(chloromethyl)benzoyl, (II) is 4-vinylbenzoyl, and (III) is selected from the group consisting of 2,4-dichlorobenzoyl and 4-bromobenzoyl.
16. The Polymer of claim 1 wherein $R^6$ is hydrogen, (I) is 4-(chloromethyl)benzoyl, (II) is 4-vinylbenzoyl, and (III) is an isomeric mixture of chlorinated 4-methylbenzoyls wherein the chlorine atoms are on the aromatic ring.
17. The Polymer of claim 1 wherein $R^6$ is hydrogen, (I) is 4-(chloromethyl)benzoyl and (III) is 2,4-dichlorobenzoyl.
18. The Polymer of claim 1 wherein $R^6$ is hydrogen, (I) is 4-(chloromethyl)benzoyl and (II) is 4-vinylbenzoyl.
19. A polymer as defined in claim 1 which also comprises at least 20 mole % of repeating units

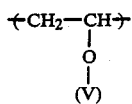 (i)

wherein Y is a haloalkyl group having from 1 to about 6 carbon atoms; wherein (V) represents a benzoyl group having the formula

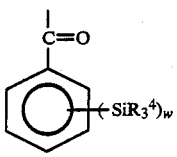

wherein w is independently an integer of 1 to 5; and wherein $R^4$ is independently an alkyl group having from 1 to 7 carbon atoms such that the $(SiR_3^4)$ group has up to a total of 9 carbon atoms.

20. A polymer of claim 19 wherein w is 1 or 2, and $R^4$ is selected from the group consisting of methyl and ethyl.

21. A polymer of claim 19 wherein said benzoyl groups of (V) are selected from the group consisting of 4-(trimethylsilyl)benzoyl; 3,4-bis(triethylsilyl)benzoyl; 2-(triethylsilyl)benzoyl; 3-(trimethylsilyl)benzoyl; 4-(tripropylsilyl)benzoyl; 4-(methyldiethylsilyl)benzoyl; and mixtures of any of the foregoing.

22. A radiation sensitive resist comprising a polymer of claim 1.

23. A radiation sensitive resist comprising a polymer of claim 2.

24. A radiation sensitive resist comprising a polymer of claim 3.

25. A radiation sensitive resist comprising a polymer of claim 4.

26. A radiation sensitive resist comprising a polymer of claim 5.

27. A radiation sensitive resist comprising a polymer of claim 6.

28. A radiation sensitive resist comprising a polymer of claim 7.

29. A radiation sensitive resist comprising a polymer of claim 8.

30. A radiation sensitive resist comprising a polymer of claim 9.

31. A radiation sensitive resist comprising a polymer of claim 10.

32. A radiation sensitive resist comprising a polymer of claim 11.

33. A radiation sensitive resist comprising a polymer of claim 12.

34. A radiation sensitive resist comprising a polymer of claim 13.

35. A radiation sensitive resist comprising a polymer of claim 14.

36. A radiation sensitive resist comprising a polymer of claim 15.

37. A radiation sensitive resist comprising a polymer of claim 16.

38. A radiation sensitive resist comprising a polymer of claim 17.

39. A radiation sensitive resist comprising a polymer of claim 18.

40. A radiation sensitive resist comprising a polymer of claim 19.

41. A radiation sensitive resist comprising a polymer of claim 20.

42. A radiation sensitive resist comprising a polymer of claim 21.

43. A polymer comprising a poly(vinyl alcohol) backbone with benzoyl groups randomly bound to said backbone by ester linkages, said polymer having the repeating units

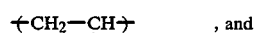 , and (i)

 , and (ii)

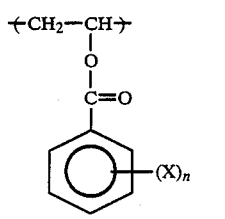 (iii)

wherein X is F, Cl, Br, I or a mixture of any of the foregoing, and n is an integer of from 1 to 5; and

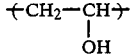 (iv)

wherein each repeating unit is of either i, ii, iii, or iv and wherein said polymers have from about 5 to about 85 mole % of repeating units of (i), from about 5 to about 45 mole % of repeating units of (ii), from about 5 to about 85 mole % of repeating units of (iii) and from about 5 to about 40 mole % of repeating units of (iv).

44. A radiation sensitive resist comprising a polymer of claim 43.

* * * * *